United States Patent

Kubota et al.

[11] Patent Number: 5,997,635
[45] Date of Patent: Dec. 7, 1999

[54] METHOD FOR FABRICATING A SINGLE-CRYSTAL SEMICONDUCTOR

[75] Inventors: Toshimichi Kubota; Toshiro Kotooka; Makoto Kamogawa, all of Hiratsuka, Japan

[73] Assignee: Komatsu Electronic Metals Co., Ltd., Kanagawa, Japan

[21] Appl. No.: 09/010,626

[22] Filed: Jan. 22, 1998

Related U.S. Application Data

[62] Division of application No. 08/801,282, Feb. 18, 1997, Pat. No. 5,853,480.

[30] Foreign Application Priority Data

Apr. 22, 1996 [JP] Japan ................................. 8-124120

[51] Int. Cl.$^6$ ........................................................ C30B 15/18
[52] U.S. Cl. ........................... 117/14; 117/15; 117/201; 117/217; 117/218; 117/222
[58] Field of Search ........................... 117/14, 15, 201, 117/202, 217, 218, 222, 900

[56] References Cited

U.S. PATENT DOCUMENTS

| | | | |
|---|---|---|---|
| 4,203,951 | 5/1980 | Coriletsky et al. | 117/213 |
| 4,944,925 | 7/1990 | Yamauchi et al. | 117/217 |
| 5,132,091 | 7/1992 | Azad | 117/217 |
| 5,137,699 | 8/1992 | Azad | 117/217 |
| 5,443,034 | 8/1995 | Everts | 117/208 |
| 5,551,978 | 9/1996 | Akashi et al. | 117/208 |

FOREIGN PATENT DOCUMENTS

| | | |
|---|---|---|
| 04012090A0 | 1/1992 | Japan . |
| 5-194076 | 8/1993 | Japan . |
| 6-144986 | 5/1994 | Japan . |
| 6-211591 | 8/1994 | Japan . |
| 6-211592 | 8/1994 | Japan . |

*Primary Examiner*—Felisa Hiteshew
*Attorney, Agent, or Firm*—McDermott, Will & Emery

[57] ABSTRACT

An apparatus and a method for fabricating a single-crystal semiconductor by means of CZ method are provided for improving the quality control through the modification of thermal cycle of a pulled single-crystal semiconductor. The apparatus includes a ring after heater which is capable of elevation. The method decreases a temperature gradient to smaller than 20° C./cm, and preferably under 15° C./cm, when the pulled single-crystal semiconductor is cooled from 1200° C. to 1000° C. The after heater therefore heats the single-crystal semiconductor where there is a temperature of 100–300° C. lower than the range of 1200–1000° C. A thermal shelter is provided to retain a temperature gradient of larger than 20° C./cm when the single-crystal semiconductor is within the temperature range between the melting point and 1250° C. The after heater and the shelter can be raised to an upper portion when polysilicon blocks are charged and a twisting step is carried out.

3 Claims, 4 Drawing Sheets

METHOD FOR FABRICATING A SINGLE-CRYSTAL SEMICONDUCTOR

This application is a Division of application Ser. No. 08/801,282 filed Feb. 18, 1997 now U.S. Pat. No. 5,853,480.

BACKGROUND OF THE INVENTION

1. Field of the Invention

The present invention relates to an apparatus and a method for fabricating a single-crystal semiconductor by means of Czochralski method, and more specifically, for fabricating a single-crystal semiconductor in which the precipitated oxygen ions and thermal donors are uniformly distributed, thereby reducing the defects in an as-grown single-crystal semiconductor and improving the strength of an oxide film.

2. Description of Related Art

Semiconductor devices are generally formed on a high-purity single-crystal silicon wafer which is, in general, fabricated by Czochralski (CZ) method. The CZ method charges polysilicon blocks in a crucible inside a single-crystal fabricating apparatus and melts the blocks by heaters around the crucible. A seed which is held by a seed holder is then immersed in the melt and lifted with rotating in clockwise or counter-clockwise direction to grow the single-crystal silicon.

The quality characteristics of the grown single-crystal silicon, such as the strength of an oxide film, the amount of oxygen precipitation, and the bulk defects, depend on the heat cycle in the CZ fabrication processes. The heat cycle has therefore been improved in certain related articles. For example, Japanese Laid Open No. 6-211591 and No. 6-211592 disclosed a method for fabricating a single-crystal silicon rod which has uniform precipitated oxygen ions and a firm oxide film. The method utilizes a ring heater whose power is supplied by a heat controller, and which is supported by an electrode, thereby gradually cooling the lifted single-crystal silicon. Moreover, the heat cycle can be modified by adjusting the power supplied to the ring heater.

However, the arrangement of the ring heater causes the following disadvantages.

1. The process cannot immediately response to the degradation of the graphite crucible and the variation lifting conditions such as the position of the melt surface and the condition of introduced gas.

2. In order to prevent the influence to the heater, the crucible must be lowered down when the polysilicon blocks are charged therein. The melt conditions are therefore affected.

3. Since the ring heater screens the seed, the twisting step for preventing stacking faults prior to the growth of the single-crystal cannot be observed.

SUMMARY OF THE INVENTION

Accordingly, the present invention provides an apparatus and a method for fabricating a single-crystal semiconductor in which the quality characteristics, such as the oxide film strength and the distributions of precipitated oxygen and bulk defects, are improved.

The present invention response immediately to the environmental variation inside a furnace, thereby melting poly-silicon blocks efficiently and facilitating the twisting step for preventing stacking faults.

The apparatus of the invention, which fabricates a single-crystal semiconductor by means of CZ method, includes an after heater around the single-crystal semiconductor; an elevator for elevating the after heater; and a controller for controlling the electric power supplied to the after heater and the elevator.

The method of the invention fabricates the single-crystal semiconductor by means of the aforementioned apparatus. In the method, a temperature gradient changes in a specific region where the pulled single-crystal semiconductor goes through, and the after heater is located where there is a temperature of about 100–300° C. lower than the temperature of the specific region, thereby heating the pulled single-crystal semiconductor.

The method is characterized in that a temperature gradient of larger than 20° C./cm exists in the pulled single-crystal semiconductor whose temperature is reduced from the melting point to 1250° C., and another temperature gradient of smaller than 20° C./cm, preferably under 15 C/cm, exists where the temperature is reduced from 1200° C. to 1000° C.

Moreover, the invention raises the after heater to the upper portion of a furnace when polysilicon blocks are charged in a crucible as well as a twisting step is carried out to eliminate stacking faults, and lowers the after heater to a predetermined position to heat a specific region of the single-crystal semiconductor when the single-crystal semiconductor is pulled.

DETAILED DESCRIPTION OF THE INVENTION

The invention provides an apparatus and a method for improving the thermal cycle in fabrication of a single-crystal semiconductor by means of CZ method. The apparatus includes an after heater and a controller for controlling the location and input power of the after heater, thereby heating a predetermined position of the growing single-crystal semiconductor and reducing thermal gradient thereof. Moreover, the apparatus responses immediately to the degradation of the graphite furnace and environmental variation inside the furnace, such as the variation of pulling conditions, by modifying the location of the after heater and its output power.

The method of the invention provides an after heater around the growing single-crystal semiconductor where the temperature is cooled to about 100–300° C., thereby reducing the temperature gradient thereof and improving the quality characteristics related to the thermal cycle, such as the oxide film strength, amount of oxygen precipitation, and bulk defects.

The formation of defects in an as-grown single-crystal silicon depends on the numbers of lattices and voids therein.

When the single-crystal silicon has a temperature of about 1180° C., the dimensions and density of the defects are determined. The invention therefore smoothes the temperature gradient of the single-crystal silicon when the temperature is reduced from 1200° C. to 1000° C. The region where the temperature is between 1100° C. and 700° C. is heated by the after heater, whereas the region near the melt surface, having a temperature of between the melting point and 1250° C., has larger temperature gradient, thereby facilitating the growth of the single-crystal. Therefore, the quality of the single-crystal silicon is improving without affecting the productivity.

The after heater can be drawn back to the upper portion of the furnace. Therefore the polysilicon blocks are charged and melted steadily, and the twisting step for prevention stacking faults can be easily observed. Moreover, the location and temperature of the after heater can be programmed in advance for performing precise thermal cycle for single-crystal silicon rod of any length.

Figure 1:
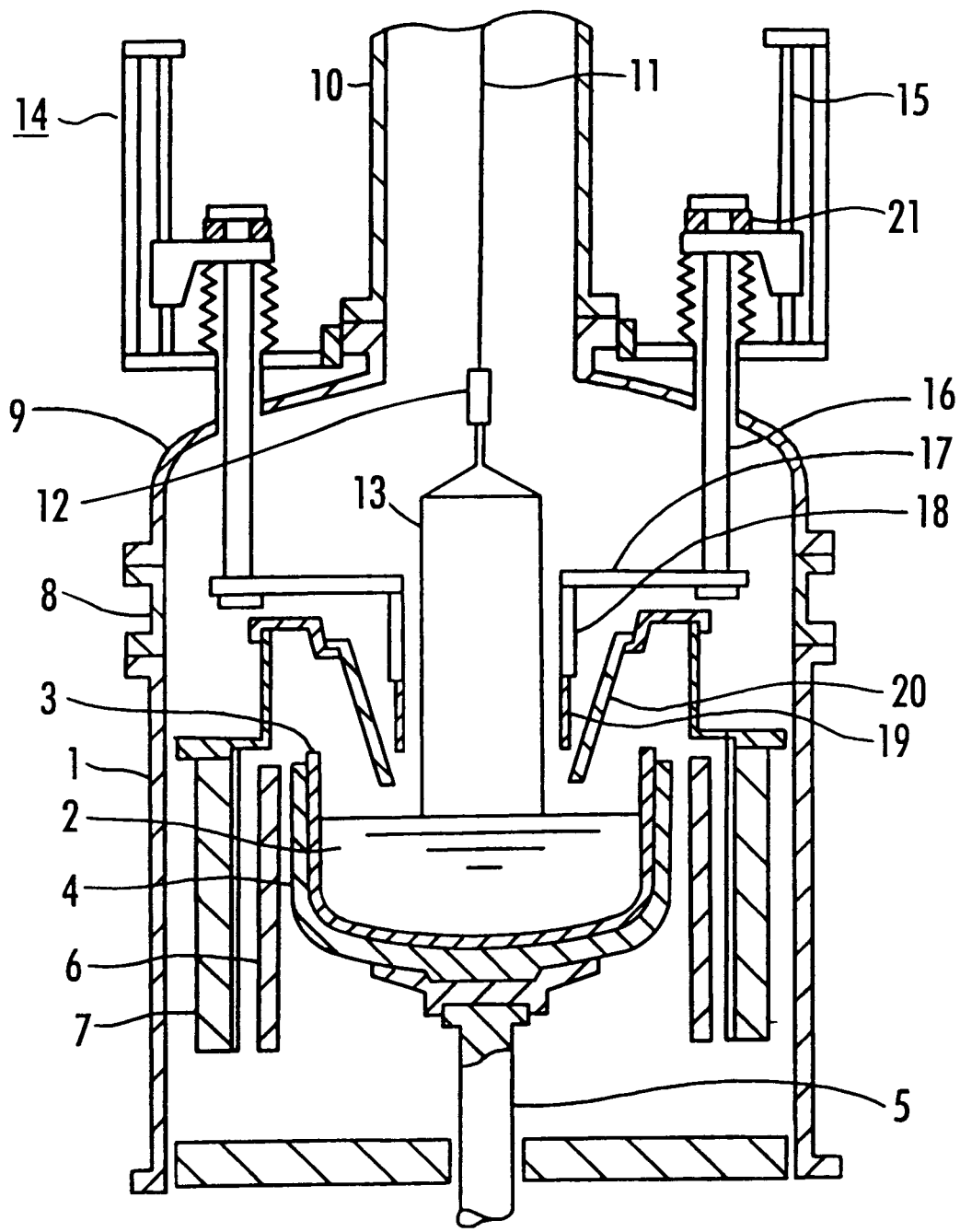
FIG. 1 is a cross-sectional view of the apparatus for fabricating a single-crystal semiconductor according to a first embodiment of the invention.

The embodiments of the invention will be described in accompaniment with the drawings. Referring to FIG. 1, the apparatus of a first embodiment has a main chamber 1. In the main chamber 1, there are a quartz crucible 3 for reserving single-crystal silicon material and a graphite crucible 4 for supporting the quartz crucible 3. The graphite crucible 4, which is capable of rotation and elevation, is arranged on a crucible spindle 5. Around the graphite crucible 4 are provided with a ring heater 6 and a thermal preserver 7.

The upper portion of the main chamber 1 is connected to a pull chamber 10 through a connecting chamber 8 and a upper chamber 9. A seed holder 12 is appended to a wire 11 which is pulled by a wire driver (not shown in the figure). When a seed held by the seed holder 12 is melted in the melt, the seed holder 12 is rotated in clockwise or counter-clockwise direction according to the graphite crucible 4, and is lifted up to the pull chamber 10. Since the connecting chamber 8 is provided for accepting an after heater and thermal shelter, the main chamber 1 can directly connect to the pull chamber 9 if the main chamber 1 is high enough.

The exterior of the pull chamber 10 has an elevator 14 and two shaft 16 which can be elevated along a guide rod 15 and are supported by a supporter 17. Another supporter 18 is attachable and removable with respect to the supporter 17. The lower end of the supporter 18 is connected to an after heater 19 which is arranged around the single-crystal silicon 13. The shaft 16, supporters 17 and 18, and the after heater 19 are all made of graphite. As controlled by an electrical controller (not shown in the figure) and through the shaft 16 and supporters 17 and 18, the high frequency power or hot resistance of the after heater 19 heats a specific region of the single-crystal silicon to a predetermined temperature. Other elevators (not shown in the figure) can be arranged around the after heater 19 for elevating a cone-shaped thermal shelter 20.

Figure 2:
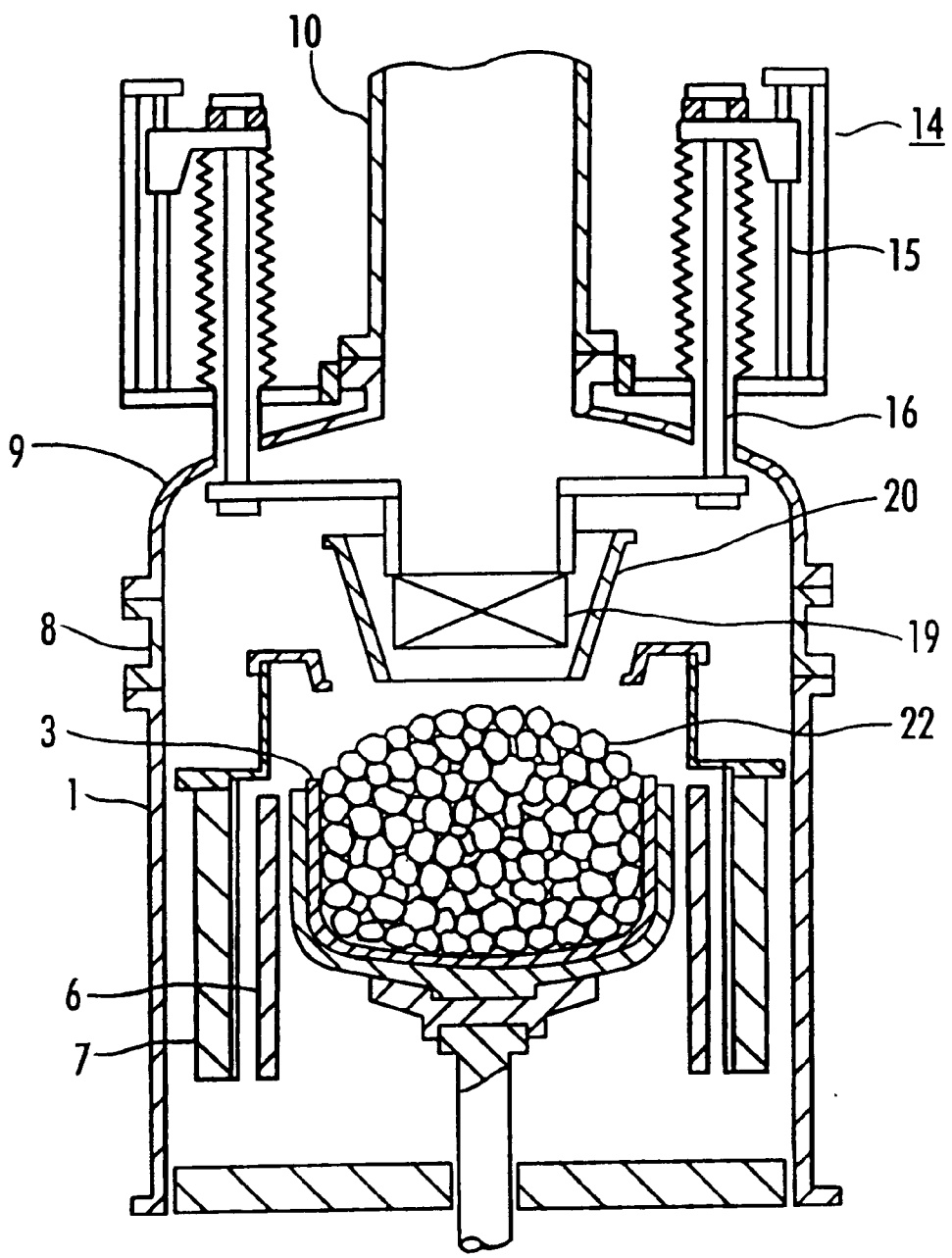
FIG. 2 is a schematic diagram illustrating that an after heater and a heat shelter of the apparatus of FIG. 1 are elevated.

The method according to the embodiment of the invention will be described. Referring to FIG. 2, the elevator 14 is driven to raise the after heater 10 when the polysilicon blocks are charged in the quartz crucible. The thermal shelter 20 is then also elevated by another not shown elevator. Therefore, a space is formed over the crucible 3 for preventing the interference between the polysilicon material 22, the after heater 19 and the thermal shelter 20. Moreover, since the crucible is located where the thermal efficiency is very high, the polysilicon material can be melted rapidly.

The non-illustrated wire driver is driven to immerse the seed in the melt when the polysilicon blocks 22 are completely melted in the crucible 3. The wire which connects the seed is then gradually pulled up for performing the twisting step for eliminating stacking faults. Since the after heater 19 and thermal shelter 20 has been drawn back in the upper portion, the process of the twisting step can be clearly observed. The after heater 19 and the thermal shelter 20 are then dropped to their predetermined position after the twisting step. For example, the after heater 19 is located around the growing single-crystal silicon where the temperature is between 800–700° C. The seed holder 12 is lifted to the pull chamber 10 for the growth of the single-crystal silicon 13. A thermometer (not shown in the figure) is provided for detecting the temperature of the after heater 19 which is sent back to the electrical controller, thereby retaining the after heater 19 in a constant temperature. The temperature of the single-crystal silicon therefore reduces gradually from 1200° C. to 1000° C. as the after heater 19 heats a specific region thereof.

Moreover, the thermal cycle which is determined by the temperature and location of the after heater 19 can be programmed in an electrical controller (not shown). Therefore, the settings of the program are adjustable as the pull length of the single-crystal silicon varies.

Various examples for fabricating the single-crystal silicon according to the aforementioned method will be described. In these examples, the output power of the after heater is 5 kW or 7 kW. The after heater can be arranged at five positions which correspond to five temperature grades between 1100° C. and 400° C. Moreover, a conventional apparatus without after heater is also utilized as reference. The outcomes of the examples, such as the temperature gradient, yield and difficulty in lifting the single-crystal silicon, are shown in Table 1.

As shown in Table 1, the yield is improved by locating the after heater near the region where the crystal temperature is about 800° C. or 700° C., no matter the output power is 5 kW or 7 kW. Therefore, the pull of the single-crystal silicon becomes easier. When the after heater is located near the region having a temperature of 1100 or 1000° C., since a temperature gradient of smaller than 20° C./cm exists in the rapid cooling region between the melting point and 1200° C., and a temperature gradient of larger than 15 C/cm exists in the gradual cooling region between 1200° C. and 1000° C., the yield is reduced to under 60%. The diameter of the lifted single-crystal silicon is therefore difficult to control. Similar situation happens when the after heater is located near the region having a temperature of 400° C. The reference case without after heater has a temperature of more than 25 C/cm in the gradual cooling region between 1200° C. and 1000° C. The yield is therefore reduced to 50%.

The examples illustrate that the after heater is preferably located where there is a crystal temperature of about 800° C. or 700° C. The temperature gradient in the gradual cooling region between 1200° C. and 1000° C. is then under 15 C/cm, thereby improving the thermal cycle of the single-crystal silicon.

Figure 3:
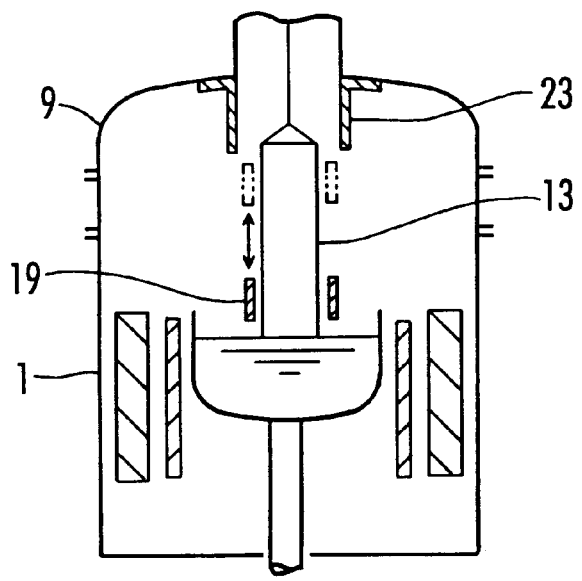
FIG. 3 is a schematic diagram illustrating the apparatus of a second embodiment of the invention.

FIG. 3 illustrates a portion of the apparatus for fabricating a single-crystal semiconductor according to a second embodiment of the invention. Referring to FIG. 3, the upper portion of the upper chamber 9 is provided with a short thermal shelter 23 with a downward orientation. Since the after heater 19 can be raised to the lower end of the thermal shelter 23, each region of the pulled single-crystal silicon can be gradually cooled.

Figure 4:
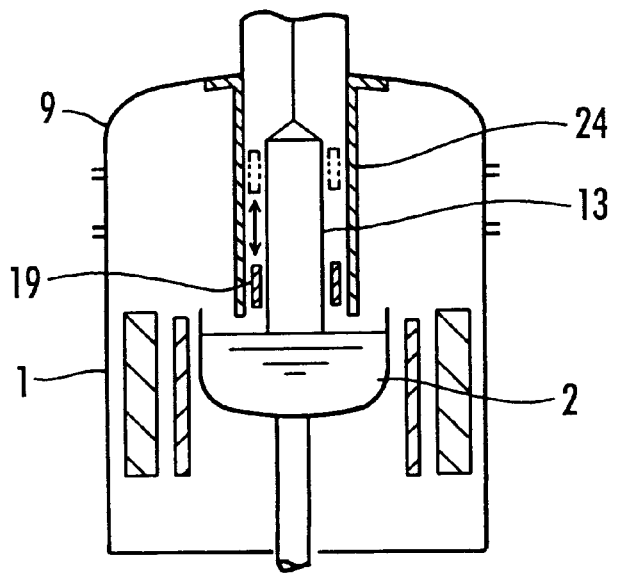
FIG. 4 is a schematic diagram illustrating the apparatus of a third embodiment of the invention.

FIG. 4 illustrates a portion of the apparatus for fabricating a single-crystal semiconductor according to a third embodiment of the invention. Referring to FIG. 4, the upper portion of the upper chamber 9 is provided with a short thermal shelter 24 with a downward orientation. The thermal shelter 24, similar to the thermal shelter 20, can reach the surface region of the melt 2. The thermal shelter 24 is capable of isolating the thermal radiation in the main chamber 1 and that in the upper chamber 9. Therefore, the specific region of the single-crystal silicon can be gradually cooled by the after heater 19 even though the growing region must be rapidly cooled. The after heater 19 is movable along the inner side of the thermal shelter 24.

Figure 5:
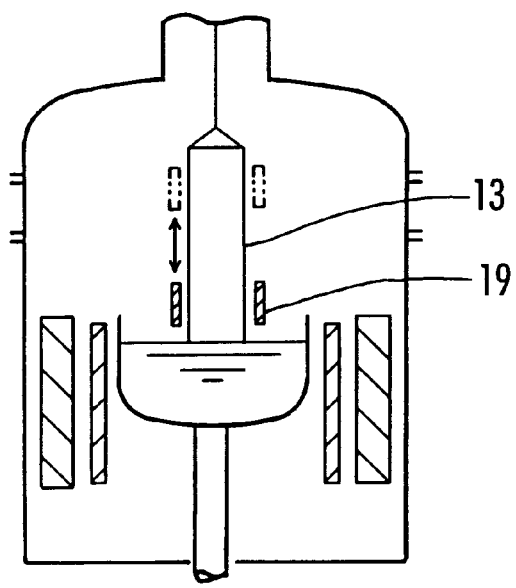
FIG. 5 is a schematic diagram illustrating the apparatus of a fourth embodiment of the invention.

FIG. 5 illustrates a portion of the apparatus for fabricating a single-crystal semiconductor according to a fourth embodiment of the invention. Referring to FIG. 5, the apparatus has the after heater 19 but no thermal shelter. The after heater 19 is capable of elevation, thereby gradually cooling a desirable region of the pulled single-crystal silicon 13.

The second, third and fourth embodiments of the invention, similar to the first embodiment, cool the specific region of the pulled single-crystal silicon, thereby providing the desirable thermal cycle. Moreover, in these embodiments, the electrical controller which controls the after heater is the same as that of the first embodiment.

Figure 6:
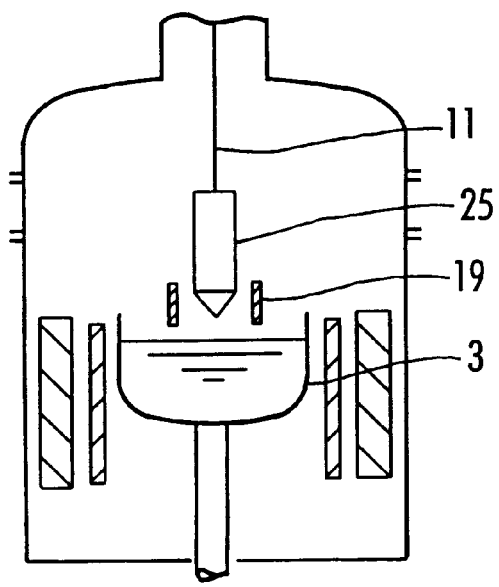
FIG. 6 illustrates an alternative configuration of the invention.

The apparatus for fabricating the single-crystal silicon not only improves the thermal cycle but increases the amount of polysilicon material charged in the crucible. For example, referring to FIG. 6, when the polysilicon blocks in the quartz crucible 3 have been melted, a polysilicon rod 25 appending to the wire 11 can be heated by the after heater 19, thereby decreasing the heavy load of the quartz crucible 3.

The invention therefore has the following advantages.

1. The apparatus and method for fabricating the single-crystal semiconductor by means of CZ method utilize the after heater to smooth the temperature gradient of the crystal in a temperature range which is very important to the quality of the single-crystal semiconductor. Therefore, the high quality single-crystal semiconductor which has high oxide film strength, low amount of oxygen precipitation and bulk defects can be easily fabricated by modifying the thermal cycle to a desirable orientation.

2. Since the after heater is capable of elevation, and its temperature is controllable, the thermal cycle of the single-crystal silicon can be precisely controlled in a wide range.

3. The after heater can be drawn back to facilitate the processes such as melting of polysilicon blocks and the twisting for eliminating stacking faults.

4. The apparatus of the invention can be established by modifying a conventional one, thereby reducing the manufacturing cost.

TABLE 1

| | Output of oiler heater | | | | | | | | | | |
|---|---|---|---|---|---|---|---|---|---|---|---|
| | 5k W | | | | | 7k W | | | | | no after heater |
| Crystal temperature of where the after h heder is located temperature gradient ° C./cm | 1100° C. | 1000° C. | 800° C. | 700° C. | 400° C. | 1100° C. | 1000° C. | 800° C. | 700° C. | 400° C. | — |
| melting point ~1250° C. | 17.5 | 19.2 | 25.5 | 28.7 | 29.0 | 15.0 | 16.8 | 23.2 | 26.2 | 28.0 | 32.1 |
| 1200° C.~1000° C. | 18.2 | 16.8 | 13.3 | 11.4 | 16.8 | 17.9 | 16.6 | 11.1 | 10.0 | 16.8 | 25.7 |
| yield (%) | 55 | 56 | 70 | 80 | 55 | 55 | 58 | 75 | 88 | 56 | 50 |
| lift difficulty | X | Δ | ○ | ◎ | ◎ | X | Δ | ○ | ◎ | ◎ | ◎ |

(note:
◎: very easy
○: easy
Δ: difficult
X: can't control the diameter)

What is claimed is:

1. A method for fabricating a single-crystal semiconductor by means of an apparatus comprising:
    an after heater around the single-crystal semiconductor;
    an elevator for elevating the after heater; and
    a controller for controlling the electric power supplied to the after heater and the elevator,
    wherein a temperature gradient changes in a specific region where the growing single-crystal semiconductor goes through, and the after heater is located where there is a temperature of about 100–300° C. lower than the temperature of the specific region, thereby heating the pulled single-crystal semiconductor.

2. The method as claimed in claim 1, wherein a temperature gradient of larger than 20° C./cm exists in the pulled single-crystal semiconductor whose temperature is reduced from the melting point to 1250° C., and another temperature gradient of smaller than 20° C./cm, preferably under 15 C/cm, exists where the temperature is reduced from 1200° C. to 1000° C.

3. A method for fabricating a single-crystal semiconductor raising an after heater to the upper portion of a furnace when polysilicon blocks are charged in a crucible and a twisting step is carried out to eliminate stacking faults, and lowering the after heater to a predetermined position to heat a specific region of the single-crystal semiconductor when the single-crystal semiconductor is pulled.

* * * * *